Dec. 12, 1961 E. BELMONT 3,012,916
SEMICONDUCTOR DEVICE
Filed Oct. 22, 1957
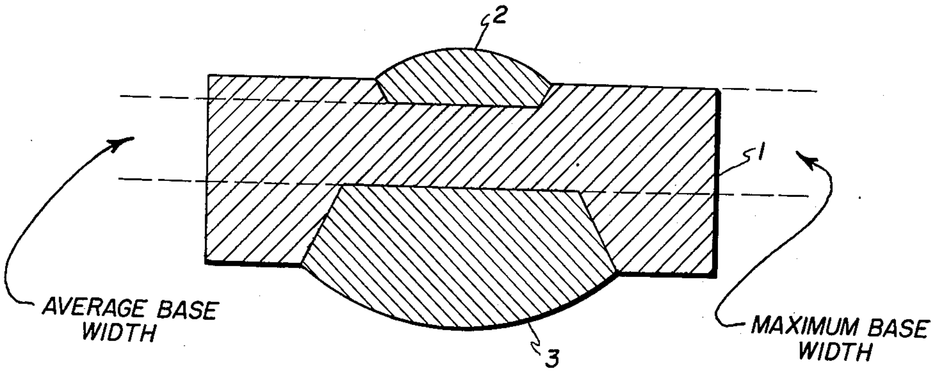
INVENTOR.
EMANUEL BELMONT
BY James M. Nichols
ATTORNEY

United States Patent Office 3,012,916

Patented Dec. 12, 1961

3,012,916

SEMICONDUCTOR DEVICE

Emanuel Belmont, Asbury Park, N.J., assignor to The Bendix Corporation, a corporation of Delaware Filed Oct. 22, 1957, Ser. No. 691,736
2 Claims. (Cl. 148—1.5)

The present invention relates to semiconductor devices and more particularly to a method for producing semiconductor devices.

In the process of manufacturing certain types of semiconductor devices appropriate materials, for example indium or its alloys, are alloyed into a body of semiconductor material, for example germanium. To achieve a high performance unit, it is desirable that the collector and emitter approach each other from opposite faces of the germanium die so as to effect a small base width. However, it has been determined that a small base width alone does not mean that the device will have good frequency cutoff and high gain.

The present invention provides a method for producing semiconductor devices that will have good frequency cutoff and high gain. By the separate control of the penetration of the emitter and collector in which the emitter penetration is held to a minimum and increased penetration provided for the collector, a device having high gain with good frequency cutoff is produced. It is an object of the present invention to produce an improved semiconductor device.

Another object of the invention is to provide an improved method for fabricating semiconductor devices.

Another object of the invention is to provide an improved method of alloying semiconductor devices.

Another object of the invention is to provide an improved semiconductor device having high gain and good frequency cutoff.

The above and other objects and features of the invention will appear more fully hereinafter from a consideration of the following description taken in connection with the accompanying drawing wherein one embodiment is illustrated by way of example.

In the drawing, the single figure is a schematic representation of an alloy semiconductor device.

In fabricating some types of semiconductor devices, indium or its alloys are alloyed into a germanium die or other suitable semiconductor material. To achieve a high performance device, it is desirable that the collector and emitter approach each other closely from opposite faces of the germanium die so as to effect a small base width. A narrow base width will also result in a higher value of the alpha frequency cutoff (i.e. common base frequency cutoff) as given by:

$$(1) \qquad f_a=600/\pi W^2$$

where $f_a$=frequency cutoff, in mc.
$W$=base width, in mils.

The beta frequency cutoff (i.e. common emitter frequency cutoff) can be approximated by:

$$(2) \qquad f_b=Kf_a/\beta$$

where $f_b$=common emitter cutoff frequency.
$\beta$=current gain
$K$=constant

Thus, increasing the depth of the alloying does not necessarily increase $f_b$ as the value of both $f_a$ and $f_b$ may increase but the quotient may not.

In the single figure of the drawing a semiconductor element is shown schematically as a germanium die 1 having an emitter 2 and collector 3 alloyed thereto. From the drawing it can be seen that the collector-to-emitter distance at the emitter periphery is greater than at the center of the emitter. Measurements have shown that the perhiperal separation is the important distance in the determination of $f_a$ while the average distance determines gain.

In order to fabricate a high gain device, with good frequency cutoff it is necessary to keep the emitter penetration to a minimum and increase the collector penetration for narrow base width. In order to accomplish the above it was found that by firing the collector at one temperature and then firing the emitter at a lower temperature that the relative depths of penetration could be controlled.

As as example, the collector was fired at temperatures between 600° to 630° C. and the emitter fired at 550° C. This produced a high gain device that had good frequency cutoff.

In addition to the control of the penetration by temperature, further control may be obtained by selecting appropriate alloys and thickness. By using a collector alloy to emitter alloy thickness ratio of 3/2 the penetration of the emitter and collector will be held to the proper ratio to provide a high gain element having good frequency cutoff. Thus, by using a collector alloy to emitter alloy thickness ratio as set forth above and firing the collector at one temperature and then firing the emitter at a lower temperature, the depth of penetration can be controlled to produce a high gain device having good frequency cutoff in which the collector to emitter ratio of penetration will be 3 to 1.

Although only one embodiment of the invention has been illustrated and described, various changes in the form and relative arrangement of the parts, which will now appear to those skilled in the art, may be made without departing from the scope of the invention.

What is claimed is:

1. A semiconductor device comprising a body of germanium, a collector of indium alloyed in said body, an emitter of indium alloyed in said body, said collector having a thickness of 3 to 2 relative to said emitter, and a penetration into said body of 3 to 1 relative to said emitter.

2. A method of producing a semiconductor device comprising alloying a collector of an indium alloy having a specific thickness into a body of germanium by firing at a temperature of 600° C. to produce a predetermined penetration, then alloying an emitter of an indium alloy having a thickness of 2 to 3 relative to said collector by firing at a temperature of 550° C. to produce a penetration into said body having a ratio of 1 to 3 relative to said collector.

References Cited in the file of this patent

UNITED STATES PATENTS

| | | |
|---|---|---|
| 2,791,524 | Ozarow | May 7, 1957 |
| 2,874,083 | Stripp et al. | Feb. 17, 1959 |

FOREIGN PATENTS

| | | |
|---|---|---|
| 643,608 | Great Britain | Jan. 18, 1956 |

OTHER REFERENCES

RCA Review, December 1953, vol. XIV, No. 4, pages 586–598.

Proceedings of the I.R.E., November 1952, pages 1352–1357.

Proceedings of the I.R.E., June 1954, pages 907–913.